United States Patent [19]

Ouchi

[11] Patent Number: 5,757,828
[45] Date of Patent: May 26, 1998

[54] SEMICONDUCTOR LASER DEVICE, METHOD FOR DRIVING THE SAME, AND OPTICAL COMMUNICATION SYSTEM USING THE SAME

[75] Inventor: Toshihiko Ouchi, Sagamihara, Japan

[73] Assignee: Canon Kabushiki Kaisha, Tokyo, Japan

[21] Appl. No.: 760,415

[22] Filed: Dec. 4, 1996

[30] Foreign Application Priority Data

Dec. 8, 1995 [JP] Japan .................................. 7-345842

[51] Int. Cl.[6] .................................. H01S 3/10; H01S 3/19
[52] U.S. Cl. .................................. 372/27; 372/46; 372/50; 372/96
[58] Field of Search .................................. 372/50, 27, 26, 372/96, 46, 45

[56] References Cited

U.S. PATENT DOCUMENTS

| | | | |
|---|---|---|---|
| 5,012,474 | 4/1991 | White et al. | 372/27 |
| 5,349,598 | 9/1994 | Ouchi et al. | 372/50 |
| 5,497,390 | 3/1996 | Tanaka et al. | 372/50 |
| 5,594,577 | 1/1997 | Majima et al. | 359/124 |
| 5,648,978 | 7/1997 | Sakata | 372/50 |
| 5,699,373 | 12/1997 | Uchida et al. | 372/27 |

FOREIGN PATENT DOCUMENTS

| | | |
|---|---|---|
| 62-42593 | 2/1987 | Japan . |
| 62-144426 | 6/1987 | Japan . |
| 2-159781 | 6/1990 | Japan . |

OTHER PUBLICATIONS

Wolf, T., et al. "Tunable Twin–Guide (TTG) Distributed Feedback (DFB) Laser with Over 10 nm Continuous Tuning Range", Electronics Letters, vol. 29, No. 24, pp. 2124–2125 (Nov. 1993).

Primary Examiner—James W. Davie
Attorney, Agent, or Firm—Fitzpatrick, Cella, Harper & Scinto

[57] ABSTRACT

A semiconductor laser device includes a semiconductor substrate, an active layer formed on the substrate extending along a light propagation direction, a first light guide layer extending along the active layer to form a waveguide together with the active layer in which light waves in two different polarization modes can be propagated, a current injection unit for injecting a laser bias current into the active layer, and a control unit for supplying one of a current and a voltage to the first light guide layer independently from the laser bias current injected by the current injection unit. The first light guide layer is formed such that coupling states, in which the light waves in the two different polarization modes are respectively coupled to the active layer and the first light guide layer, can be changed independently from each other by controlling one of the current and the voltage supplied by the control unit. Centers of the light distributions of propagated light waves for the two different polarization modes can be shifted upward or downward differently from each other, so that the coupling degrees of the propagated light waves in the two polarization modes to the active layer are differently controlled to change the threshold current density for at least one of the different polarization modes.

32 Claims, 12 Drawing Sheets

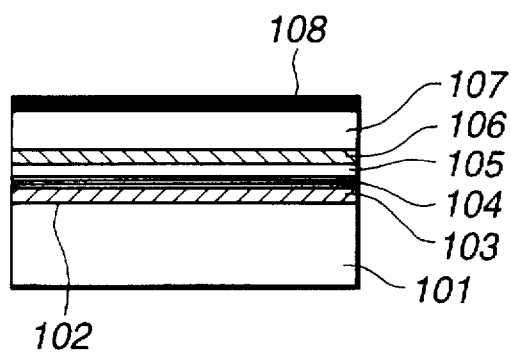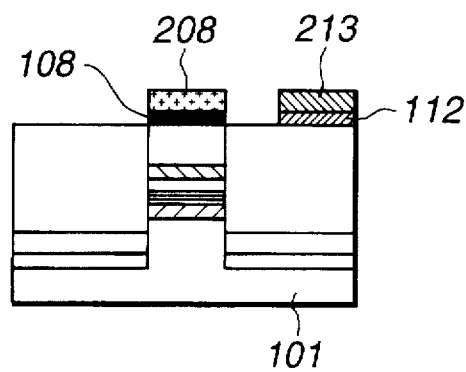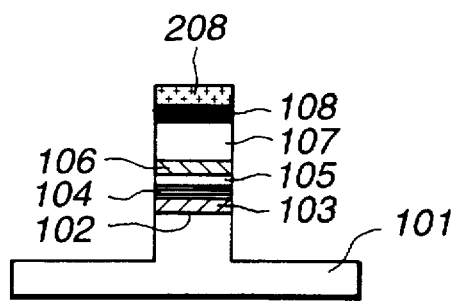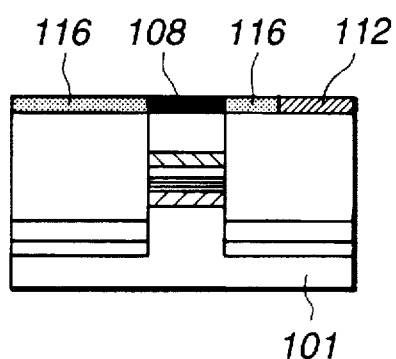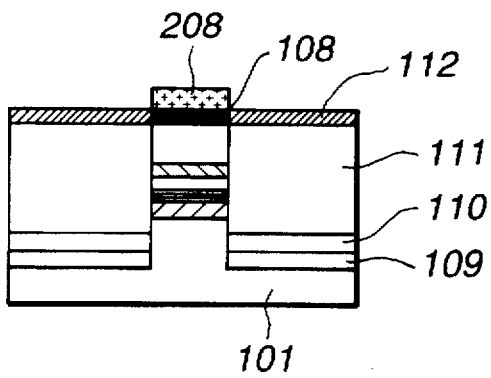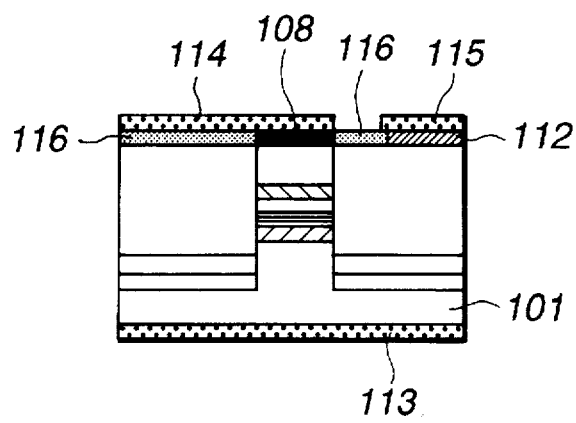

SEMICONDUCTOR LASER DEVICE, METHOD FOR DRIVING THE SAME, AND OPTICAL COMMUNICATION SYSTEM USING THE SAME

BACKGROUND OF THE INVENTION

1. Field of the Invention

The present invention relates to a semiconductor laser device, such as an oscillation polarization-mode switchable semiconductor laser whose oscillation polarization mode can be changed by a modulation current or voltage supplied thereto and which can reduce a dynamic wavelength fluctuation even during a high-speed modulation time and stably achieve high-density wavelength division multiplex communications, for example. The present invention also relates to a light source apparatus, an optical communication method, an optical communication system using the semiconductor laser device, and a driving method for driving the semiconductor laser device.

2. Related Background Art

In recent years, increased transmission capacity in the field of optical communications has become desirable, and the development of optical frequency division multiplex (FDM) communications, in which signals at a plurality of optical frequencies are multiplexed in a single optical fiber, has been advanced. In the optical FDM systems, it is important to lessen wavelength intervals between signal channels to increase the transmission capacity. For that purpose, it is desirable to reduce the occupied frequency band range or spectral line width of a laser that is used as a light source in the system. However, in a direct optical intensity modulation system or a direct amplitude shift keying (ASK) modulation system in which the output intensity of a light source is modulated by directly driving the light source according to a signal employed in present optical communications, the spectral line width is widened to about 0.3 nm during the modulation due to the dynamic wavelength fluctuation. Hence, the direct ASK modulation system is unsuitable for the optical FDM communications.

On the other hand, as a system in which the spectral line width is not widened during the modulation, an external modulation system and a direct polarization-mode modulation system have been proposed (see, for example, Japanese Patent Application Laid-Open Nos. 62-42593 (1987), 62-144426 (1987) and 2-159781 (1990)). In the external modulation system, a laser is continuously oscillated and a light output from the laser is modulated by an external modulator according to a signal to be transmitted. The present invention is generally connected with such a direct polarization-mode modulation system. Accordingly, the direct polarization-mode modulation system will be described in detail in the following.

In the direct polarization-mode modulation system, when a laser 1000 as illustrated in FIG. 1A is modulated by a minute square current pulse $\Delta I_1$ while bias currents $I_1$ and $I_2$ are fixed at points at which the oscillation is switchable between a transverse electric (TE) mode and a transverse magnetic (TM) mode as illustrated in FIG. 1B, the polarization mode of oscillated light is switched between those two different modes as illustrated in FIG. 1C. To attain the ASK transmission, a polarizer 1001 is placed in front of the emission end facet of the laser 1000 as illustrated in FIG. 1A and either of the two different polarization modes is selected. Such a polarization-mode switchable laser can be obtained by modifying the structure of an ordinary distributed feedback laser (DFB) with a diffraction grating g, and the dynamic wavelength fluctuation thereof is still smaller than the external modulation system, even though the direct modulation system is adopted in the direct polarization-mode modulation system.

The principle of the direct polarization-mode modulation system will be described. When the modulation current $\Delta I_1$ is superposed on the bias current $I_1$ as illustrated in FIG. 1A, a round-trip phase difference varies in the DFB laser. As a result, loss due to the diffraction grating or the laser's threshold gain is changed. Since the effective refractive index of a waveguide of the laser for the TE mode differs from that for the TM mode, the manner of a change in the round-trip phase difference or in the threshold gain is different between the TE mode and the TM mode. Accordingly, a magnitude relationship between the threshold gains for the TE mode and the TM mode is varied, so that the polarization-mode modulation or switching is achieved. At this time, the oscillation occurs in one of the two polarization modes whose threshold gain is smaller than the other.

Thus, in such a polarization-mode switchable DFB laser, the polarization-mode switching is performed by controlling the phase, but the gain itself is not largely varied. Therefore, the laser needs to be fabricated very precisely such that gains for the TE mode and the TM mode are close to each other at a wavelength near the oscillation wavelength of the DFB mode or the Bragg wavelength. Specifically, gain peaks for the TE mode and the TM mode of the active layer need to be made equal to each other, or the gain peak wavelength and the Bragg wavelength of the diffraction grating need to be close to each other in a narrow range having a width of the order of several nanometers. Hence, such a DFB laser is difficult to fabricate with a good reproducibility or yield. Further, since laser characteristics of such a DFB laser are greatly influenced by the phase shift amount of the diffraction grating and reflection at the end facet of the laser, such phase shift amount, antireflection coating on the end facet and the like must be regulated with high precision.

Moreover, even if the laser is fabricated with a certain degree of precision, the difference in the threshold gain between the TE mode and the TM mode, an initial phase shift of the diffraction grating and so forth fluctuate among individual laser devices due to their fabrication errors. As a result, the laser bias current for the polarization-mode switching, the amplitude of the modulation current, etc., vary among the devices. Thus, the productivity of the devices is decreased.

SUMMARY OF THE INVENTION

It is an object of the present invention to provide a semiconductor laser device in which a threshold gain for a laser oscillation polarization mode is controlled by changing the magnitude of a coupling of a propagated light wave to an active layer by the control of a current or a voltage supplied to a light guide layer, rather than by the control of a phase, such that laser characteristics are not adversely affected by deviation from design values which occurs during the fabrication of the device and that a polarization-mode switchable semiconductor laser can be stably produced with good yield.

Another object is to provide a light source apparatus, an optical communication method or system using the semiconductor laser device, and a driving method for driving the semiconductor laser device.

According to one aspect of the present invention, there is provided a semiconductor laser device which includes a semiconductor substrate, an active layer formed on the substrate extending along a light propagation direction, a first light guide layer extending along the active layer to form a waveguide together with the active layer in which light waves in two different polarization modes (typically, a transverse electric (TE) mode and a transverse magnetic (TM) mode) can be propagated, a current injection unit for injecting a laser bias current into the active layer and a control unit for supplying one of a current and a voltage to the first light guide layer independently from the laser bias current injected by the current injection unit. The first light guide layer is formed such that coupling states, in which the light waves in the two different polarization modes are respectively coupled to the active layer and the first light guide layer, can be changed independently from each other by controlling one of the current and the voltage supplied by the control unit. Centers of the light distributions of propagated light waves for the two different polarization modes can be shifted upward or downward differently from each other, so that the coupling degrees of the propagated light waves in the two polarization modes to the active layer are differently controlled to change the threshold current density for at least one of the different polarization modes.

More specifically, the following structures are possible.

The semiconductor laser device further includes a second light guide layer extending along the active layer to form the waveguide together with the active layer and the first light guide layer. In such a semiconductor laser device, the active layer is sandwiched between the first and second light guide layers. The current injection unit injects a common laser bias current into the active layer and the second light guide layer, and the first light guide layer is formed such that coupling states, in which the light waves in the two different polarization modes are respectively coupled to the active layer and the first and second light guide layers, can be changed independently from each other by controlling one of the current and the voltage supplied by the control unit. The active layer and the second light guide layer are preferably located close to each other to obtain a strong optical coupling therebetween, so that the control efficiency of a degree of the optical coupling is enhanced.

The semiconductor laser device further includes a diffraction grating extending along the active layer and formed on the second light guide layer (for example, at a boundary between the substrate and the second light guide layer). The laser device is constructed as a distributed feedback laser with the diffraction grating which enables a single longitudinal-mode oscillation. The diffraction grating is formed on the second light guide layer to which neither voltage nor current is supplied by the control unit.

The active layer and the first light guide layer (and the second light guide layer when this layer is provided) constitute the waveguide in which those layers are optically coupled to each other strongly such that a propagation transverse mode remains unchanged along the waveguide. The optical coupling degree can be effectively controlled, and hence the polarization-mode switching can be effectively controlled.

The semiconductor laser device further includes a diffraction grating extending along and near the active layer. The laser device is constructed as a distributed feedback laser with the diffraction grating which enables a single longitudinal-mode oscillation.

The diffraction grating contains a phase shift section such that the single modal characteristic is further improved. Thus, the oscillation polarization-mode switching and/or wavelength tuning can be performed with the single mode maintained.

The semiconductor laser device with the diffraction grating further includes end facets and an antireflection coat provided on at least one of the end facets of the laser device such that the single modal characteristic is further improved.

The semiconductor laser device further includes a third light guide layer and a diffraction grating formed along the third light guide layer. The third light guide layer and the diffraction grating are serially coupled to the active layer and the first light guide layer along the light propagation direction, and the laser device is constructed as a distributed Bragg reflector (DBR) laser in which a distributed reflector of the diffraction grating is formed along the light propagation direction to enable a single longitudinal-mode oscillation.

The DBR semiconductor laser device further includes a second current injection unit for injecting a current into the third light guide layer to change a refractive index thereof. Thereby, a laser oscillation wavelength can be varied by changing the current injected into the third light guide layer by the second current injection unit.

The first light guide layer is comprised of a multiple quantum well layer which is constructed such that a change in a refractive index of the first light guide layer for the TE mode is larger than a change in a refractive index of the first light guide layer for the TM mode at the time when the refractive index of the first light guide layer is varied by applying a reverse voltage thereto by the control unit and that an oscillation polarization mode of the laser device can be switched from the TE mode to the TM mode due to the control of the coupling states when the reverse voltage is applied to the first light guide layer by the control unit.

The first light guide layer has a multiple quantum well layer which is constructed such that a change in a refractive index of the first light guide layer for the TE mode is larger than a change in a refractive index of the first light guide layer for the TM mode, at the time when the the refractive index of the first light guide layer is varied, by injecting a forward current thereinto by the control unit. In the multiple quantum well layer, an oscillation polarization mode of the laser device can be switched from the TM mode to the TE mode by controlling the coupling states when the forward current is injected into the first light guide layer by the control unit. When the forward current is injected, the refractive index of the first light guide layer is changed (i.e., lowered), due to the plasma effect, and the light distribution in the TE mode approaches the active layer. Hence, the oscillation polarization mode of the laser device can be switched from the TM mode to the TE mode.

The multiple quantum well layer contains a plurality of well layers to which a compressive strain is applied to increase the polarization-mode dependency. This permits polarization-mode switching to be performed more effectively.

The semiconductor laser device further includes a diffraction grating to constitute one of a distributed feedback laser and a distributed Bragg reflector laser. The active layer is comprised of a multiple quantum well layer, and a pitch of the grating is set such that a Bragg wavelength due to the grating falls near a wavelength corresponding to a bandgap energy between a ground level of light holes and a ground level of electrons of the active layer, which imparts a gain chiefly to the TM mode. The pitch of the grating is also set such that threshold gains at the Bragg wavelength for the TE mode and the TM mode are approximately equal to each other. The polarization-mode switching between the TE mode and the TM mode can be effectively performed.

The active layer is comprised of a multiple quantum well layer into which a tensile strain is introduced such that a bandgap energy beween a ground level of heavy holes and a ground level of electrons is substantially equal to or larger than a bandgap energy beween a ground level of light holes and the ground level of electrons. Thus, threshold gains at the Bragg wavelength for the TE mode and the TM mode are made close to each other. The polarization-mode switching between the TE mode and the TM mode can be effectively performed.

The semiconductor laser device futher includes a burying layer for laterally surrounding the waveguide and a barrier layer interposed between the active layer and the first light guide layer. Conductivity types (n-type or p-type) are the same for a substrate side and a topmost layer of the laser structure. The conductivity type of the barrier layer is different from the conductivity type of the substrate side and the topmost layer. The conductivity type of the burying layer is the same as the conductivity type of the barrier layer, such that p-n junctions are respectively formed through the active layer as an inbetween and through the first light guide layer as an inbetween. With this arrangement, an oscillation polarization mode of the laser device can be switched between the two different polarization modes mode by changing one of the current and the voltage supplied to the first light guide layer by the control unit. The amount of power consumption needed for the polarization-mode modulation can be reduced, and high-speed driving achieved thereby.

Each of the current injection unit and the control unit includes a common electrode formed on the burying layer.

The current injection unit includes a plurality of common electrodes formed on the burying layer along the light propagation direction of the waveguide and an electrode formed on a bottom surface of the substrate. The control unit includes the common electrodes and an electrode formed on the first light guide layer such that one of the current and the voltage can be unevenly supplied to the first light guide layer along the light propagation direction of the waveguide. With this arrangement, a laser oscillation wavelength can be varied by changing an uneven current injected into the active layer along the light propagation direction by the current injection unit. This arrangement also allows the oscillation polarization mode to be switched by changing one of the current and the voltage supplied to the first light guide layer partly along the light propagation direction.

The active layer is comprised of a single layer composed of a semiconductor compound.

The semiconductor laser device further includes a diffraction grating to constitute one of a distributed feedback laser and a distributed Bragg reflector laser. The active layer is comprised of a non-strained multiple quantum well layer, and a pitch of the grating is set such that a Bragg wavelength falls near a wavelength corresponding to a bandgap energy between a ground level of light holes and a ground level of electrons of the active layer.

The first light guide layer is comprised of a single layer composed of a semiconductor compound such that a refractive index thereof is changed due to the Franz-Keldysh effect.

The semiconductor laser device further includes cleaved end facets to constitute a Fabry-Perot laser.

According to another aspect of the present invention, there is provided a method for driving a semiconductor laser device described above. The driving method includes a step of injecting a laser bias current into the active layer, a step of supplying one of a current and a voltage to the first light guide layer and a step of changing one of the current and the voltage independently from the laser bias current to perform the oscillation polarization-mode switching between the two different polarization modes. This method reduces the amount of power consumption needed for polarization-mode modulation, and permits high-speed driving.

According to another aspect of the present invention, there is provided another method for driving a semiconductor laser device described above. The driving method includes a step of changing an uneven current injected into the active layer along the light propagation direction by using the common electrodes to change a laser oscillation wavelength of the laser device. The method also includes a step of changing one of a current and a voltage supplied to the first light guide layer partly along the light propagation direction by using the common electrodes to perform the oscillation polarization-mode switching between the two different polarization modes.

According to another aspect of the present invention, there is provided yet another method for driving a DBR semiconductor laser device described above. The driving method includes a step of changing a current injected into the third light guide layer by the second current injection unit to change a laser oscillation wavelength of the laser device. The method also includes a step of changing one of a current and a voltage independently from the laser bias current to perform the oscillation polarization-mode switching between the two different polarization modes. Thus, the oscillation polarization-mode switching and wavelength tuning can be performed with the single mode maintained.

According to another aspect of the present invention, there is provided an optical communication system for communicating over a light transmission line that transmits signals from a transmitter side to a receiver side. The system includes a semiconductor laser device described above, and a polarization-mode selecting unit for selecting light in one of the two different polarization modes emitted from the semiconductor laser device. The device also includes a coupling unit for coupling light in one of the two different polarization modes from the semiconductor laser device to the light transmission line, and a receiver for detecting the light in one of the two different polarization modes transmitted through the light transmission line, which is disposed on the receiver side. Using this system, polarization-mode modulation transmission with small chirping can be achieved. The structure of the receiver can be simplified because direct detection is only required for the the receiver. Thus, a relatively low-cost optical communication system can be readily built.

When the semiconductor laser device is constructed such that an oscillation wavelength thereof can be changed, the receiver detects the light at a wavelength selected by a tunable band pass filter. A high-density wavelength division multiplex transmission can be achieved at a relatively low cost and with large throughput.

According to another aspect of the present invention, there is provided an opto-electric converting apparatus which includes a semiconductor laser device described above, as well as a polarization-mode selecting unit for selecting light in one of the two different polarization modes emitted from the semiconductor laser device. The apparatus also includes a coupling unit for coupling light in one of the two different polarization modes from the semiconductor laser device to a light transmission line and a receiver for detecting the light in one of the two different polarization modes transmitted through the light transmission line. The communication system can be simplified because the transmitter and the receiver are contained in a single unit.

When the semiconductor laser device is constructed such that an oscillation wavelength thereof can be changed, the receiver detects the light at a wavelength selected by a tunable band pass filter.

According to still another aspect of the present invention, there is provided a light source apparatus which includes a semiconductor laser device described above and a polarization-mode selecting unit for selecting light in one of the two different polarization modes emitted from the semiconductor laser device.

According to yet another aspect of the present invention, there is provided a optical cable television system for communicating over a light transmission line that transmits signal light from a broadcasting center to a subscriber side. The system includes a semiconductor laser device described above, and a polarization-mode selecting unit for selecting light in one of the two different polarization modes emitted from the semiconductor laser device. The device also includes a coupling unit for coupling light in one of the two different polarization modes from the semiconductor laser device to the light transmission line, a receiver, and an optical filter for detecting light in one of the two different polarization modes transmitted through the light transmission line. The semiconductor laser device, the polarization-mode selecting unit and the coupling unit are disposed at the broadcasting center, and the receiver and the optical filter are disposed on the subscriber side.

These advantages and others will be more readily understood in connection with the following detailed description of the preferred embodiments in conjunction with the drawings.

BRIEF DESCRIPTION OF THE DRAWINGS

FIGS. 4A–4F are cross-sectional views illustrating a fabrication method of the first embodiment of the present invention.

DESCRIPTION OF THE PREFERRED EMBODIMENT

First Embodiment

Figure 1A:
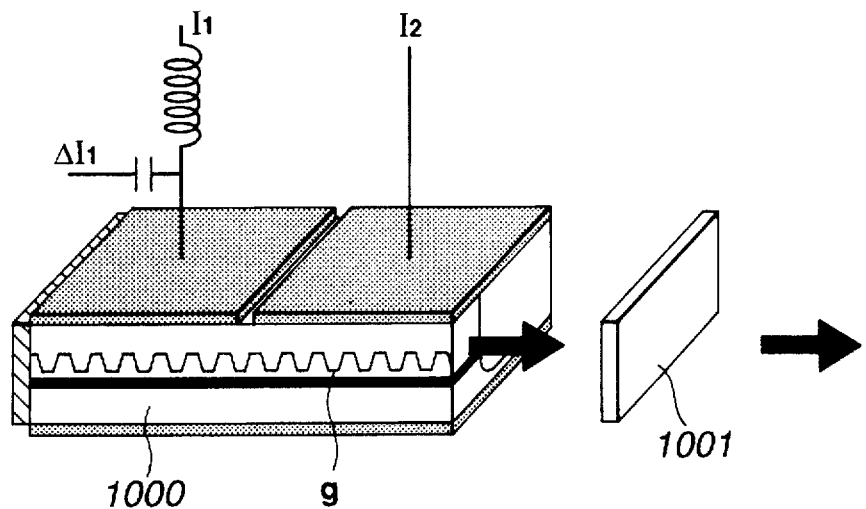
FIG. 1A illustrates a conventional polarization-mode switchable laser.
Figure 1B:
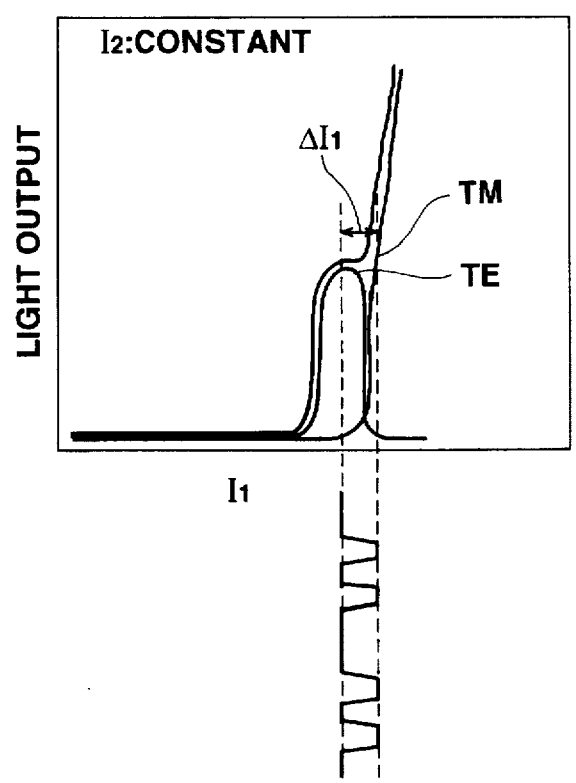
FIG. 1B is a graph for explaining a driving method for driving the conventional polarization-mode switchable laser illustrated in FIG. 1A.
Figure 1C:
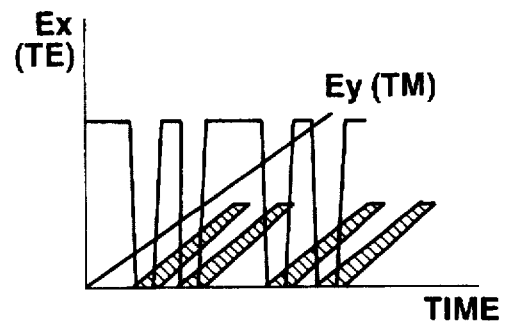
FIG. 1C illustrates the polarization mode of light from the conventional polarization-mode switchable laser modulated by the driving method explained in FIG. 1B.
Figure 2:
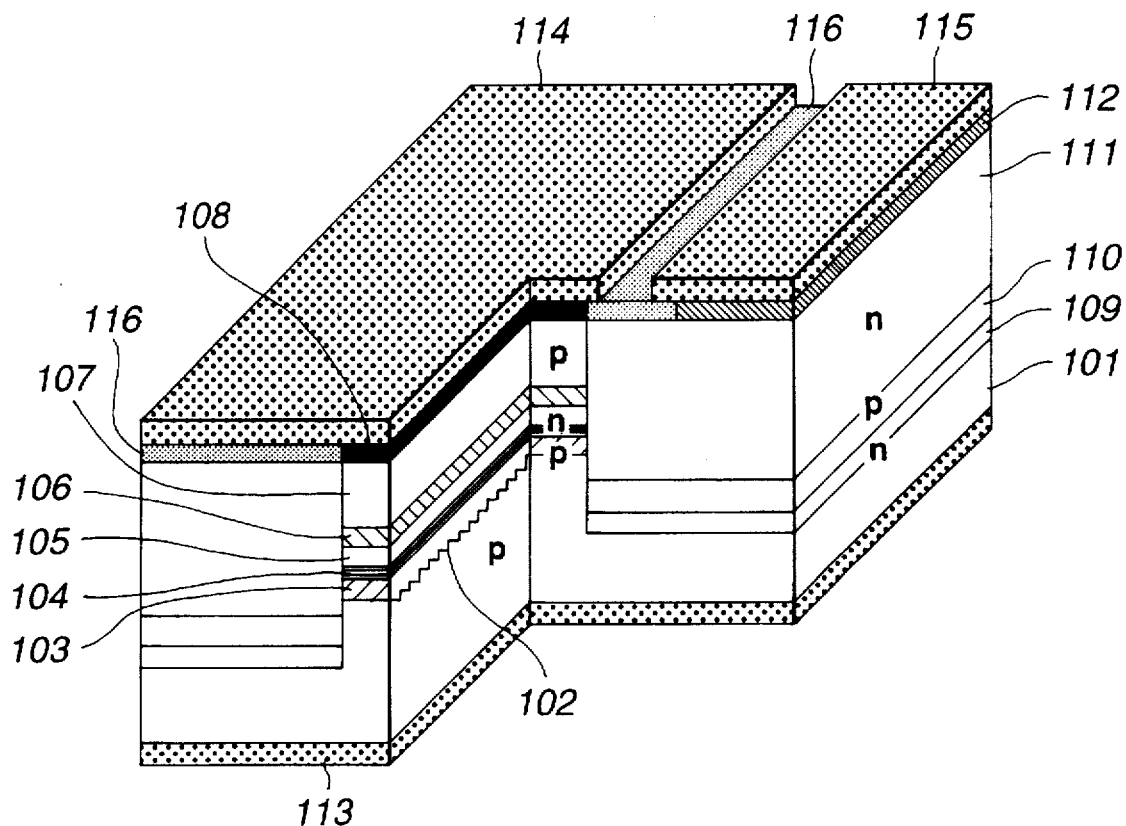
FIG. 2 is a partly cut-away perspective view illustrating a first embodiment of a DFB laser constructed in accordance with the present invention.
Figure 3:
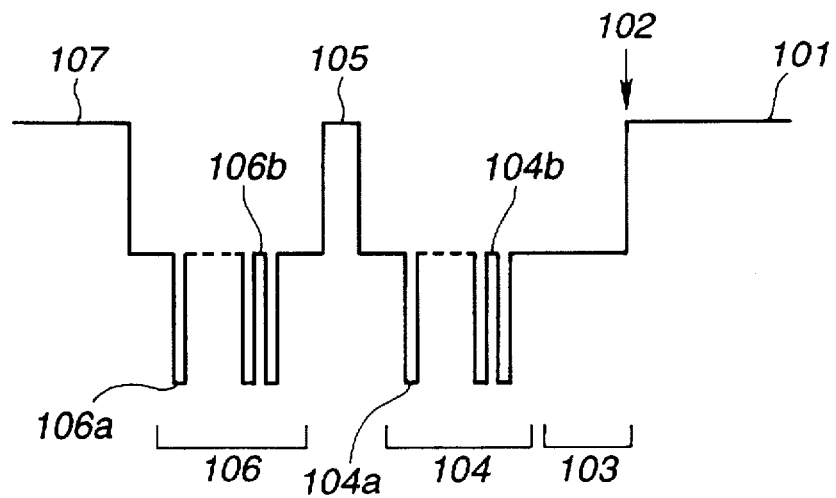
FIG. 3 is a view illustrating the energy band structure of layers near an active layer in the first embodiment of the present invention.

A first embodiment of the present invention will be described with reference to FIGS. 2 through 8D. FIG. 2 is a perspective view (partly broken) of a DFB laser of a first embodiment, in which bandgap wavelengths (the bandgap wavelength is a wavelength corresponding to a bandgap energy) of an active layer and an upper light guide layer are respectively 1.56 µm and 1.45 µm, to form a separate carrier and optical confinement heterostructure (SCH)—multiple quantum well (MQW) structure. The energy band diagram of layers near the active layer is illustrated in FIG. 3. The layer structure of the first embodiment will be described.

In FIG. 2, a diffraction grating 102 is formed on a p-type InP substrate 101. On the substrate 101, a p-type InGaAsP lower light guide layer 103, an undoped strained MQW active layer 104, an n-type InP barrier layer 105, an undoped SCH-MQW upper light guide layer 106, a p-type InP clad layer 107, and a p-type $In_{0.53}Ga_{0.47}As$ contact layer 108 are consecutively grown. The thickness and the bandgap wavelength of the lower light guide layer 103 are, respectively, 0.1 µm and 1.15 µm. The strained active layer 104 consists of ten pairs of intrinsic $In_{0.28}Ga_{0.72}As$ well layers 104a (their thickness: 10 nm) and intrinsic InGaAsP barrier layers 104b (their thickness: 10 nm and their bandgap wavelength: 1.15 µm), and a pair of intrinsic InGaAsP SCH layers (their thickness: 20 nm and their bandgap wavelength: 1.15 µm). The thickness of the n-type InP barrier layer 105 is 0.2 µm. The upper light guide layer 106 consists of ten pairs of intrinsic $In_{0.53}Ga_{0.47}As$ well layers 106a (their thickness: 4 nm) and intrinsic InGaAsP barrier layers 106b (their thickness: 10 nm and their band gap wavelength: 1.15 µm), and a pair of intrinsic InGaAsP SCH layers (their thickness: 50 nm and their bandgap wavelength: 1.15 µm). A ridge structure of those layers is surrounded, on both sides of the ridge structure, by an n-type InP burying layer 109, a p-type InP burying layer 110, an n-type InP burying layer 111, and an n-type $In_{0.53}Ga_{0.47}As$ contact layer 112. Further, p-side Cr/AuZnNi/Au electrode layers 113 and 114 are respectively formed on the bottom surface of the substrate 101 and the p-type contact layer 108. An n-side AuGeNi/Au electrode layer 115 is formed on the n-type contact layer 112. An $SiN_x$ insulating layer 116 is formed to electrically separate the electrodes 114 and 115 from each other and to electrically separate the electrode 114 from the n-type InP burying layer 111 on one side of the ridge structure (in FIG. 2, on a right side of the ridge structure).

The fabrication method of the device of the first embodiment will be described with reference to FIGS. 4A–4F.

Initially, the grating 102 is formed on the p-type InP substrate 101 by a pattern formation by a two-beam interference exposure method and dry etching with a reactive ion beam etching (RIBE). Then, the lower light guide layer 103, the active layer 104, the InP barrier layer 105, the upper light guide layer 106, the clad layer 107, and the contact layer 108 are grown in this order by a chemical beam epitaxy (CBE) method or the like (see FIG. 4A which is a cross section of the wafer in the cavity direction).

A stripe of an $SiO_2$ mask 208 having a width of about 2 µm is formed extending along the cavity direction, and an etching is performed down to the p-type InP substrate 101 by RIBE (see FIG. 4B which is a cross section of the wafer in a direction perpendicular to the cavity direction).

Then, a burying growth of the n-type InP 109, the p-type the InP 110, the n-type InP 111 and the n-type InGaAs 112 is executed on both sides of the ridge structure formed in the step of FIG. 4B, using a metal organized vapor phase epitaxy (MOVPE) or the like (see FIG. 4C).

A strip-shaped n-type InGaAs 112 is formed by photolithography and RIBE with a strip-shaped mask 213 being used (see FIG. 4D).

An $SiN_x$ layer 116 is formed by photolithography on portions other than the two contact layers 108 and 112 (see FIG. 4E).

Finally, the electrodes 113, 114 and 115 are formed by a lift-off method or the like (see FIG. 4F).

In the DFB laser of this embodiment, the active layer 104 is a tensile-strained MQW active layer, and the transition energy (EhhO-EeO) between a ground level of heavy holes and a ground level of electrons is set equal to the transition energy (ElhO-EeO) between a ground level of light holes and the ground level of electrons. Therefore, an oscillation threshold value for the TM mode is low, compared with that of an ordinary DFB laser. Hence, the polarization mode switching can be effectively performed.

In this embodiment of the invention, a semiconductor laser device performs an oscillation polarization-mode switching by positively varying gains for two different polarization modes, instead of changing a phase. The principle of the device of the present invention is typically represented by a specific model of this embodiment illustrated in FIGS. 2 and 3. In this model, the lower light guide layer 103 with the diffraction grating 102 is formed under the active layer 104 and the upper light guide layer 106 is formed on the InP barrier layer 105, as described above. The device is constructed such that a current injection into the active layer 104 can be carried out independently from an electric-field application to, or a current injection into, the upper light guide layer 106 which acts as a layer for regulating the distribution of propagated light.

The structure of this model is apparently similar to a tunable twin guide (TTG) type laser (see T. Wolf et al., Electronics Lett., 29, p. 2124, 1993) and a twin (TW) laser (see Yamamoto et al., Technology Study Group Report of Electronic Communication Japan Academic Society, QE91-41, p.55). Those structures, however, are different from the model illustrated in FIG. 2, in that the structures described in those publications only deal with light in the TE mode, and those described structures have a diffraction grating formed on the upper light guide layer and the lower light guide layer itself is an active layer.

For example, when a reverse voltage is applied across the upper light guide layer 106, the bandgap energy thereof is narrowed (i.e., the refractive index thereof is increased) to approach the bandgap energy of the laser active layer 104.

Figure 6A:
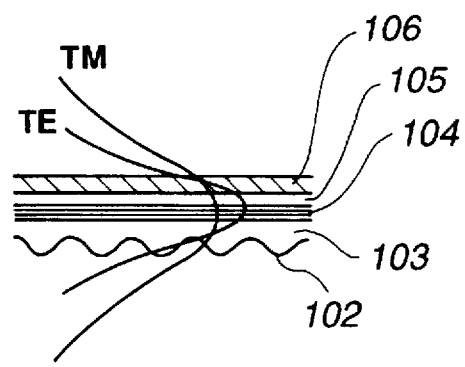
FIGS. 6A and 6B are respectively views illustrating changes of light distributions in the TE mode and the TM mode of the first embodiment of the present invention.
Figure 6B:
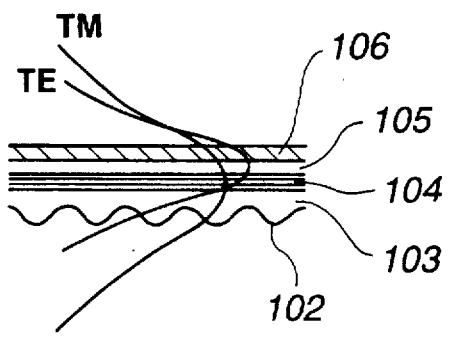

As a result, the light distribution of laser oscillation light in a layering direction is shifted upward as illustrated in FIG. 6B. Hence, the coupling efficiency of the propagated light to the diffraction grating is lowered and a gain in the active layer 104 is reduced, leading to an increase in the oscillation threshold. Here, when a multiple quantum well structure is used as the upper light guide layer 106, the change in the refractive index or the bandgap energy due to the applied electric field (see FIG. 7) depends on the polarization mode. The refractive index or the transition energy (EhhO-EeO) varies widely for the TE mode, as seen by the steep slope of line in FIG. 7 for the TE mode. In contrast, the refractive index or the transition energy (ElhO-EeO) is only slightly changed for the TM mode, as seen by the gradual slope of the line in FIG. 7 for the TM mode. Thus, polarization-mode switching is executed by utilizing the polarization-mode dependency of the quantum confinement Stark effect. Specifically, when the device is constructed such that the threshold for the TE mode is low under a condition in which no voltage is applied, the oscillation occurs in the TE mode at the time of non-voltage. When the reverse voltage is applied to the upper light guide layer 106, the threshold for the TE mode increases and becomes higher than the threshold for the TM mode and the oscillation occurs in the TM mode.

As described referring to this model, there are two setting parameters of the laser bias current and the electric field, and hence the fabrication error can be compensated for by a driving method of the device.

In the above structure, the diffraction grating is advantageously formed on the lower light guide layer 103 as illustrated in FIG. 2 in view of the efficiency of the refractive index change, the reduction of chirping during the polarization-mode switching, and the like. That is, when the light distribution is shifted upward, the light distribution moves away from the diffraction grating 102 and the coupling efficiency is reduced, leading to a more effective decrease of the gain. If the diffraction grating is formed on the upper light guide layer 106, the Bragg wavelength is changed due to the change in the refractive index of the upper light guide layer 106 when the voltage is applied thereto, so that fluctuation of the oscillation wavelength occurs.

A more specific manner of the operation of the first embodiment will be described.

Figure 5:
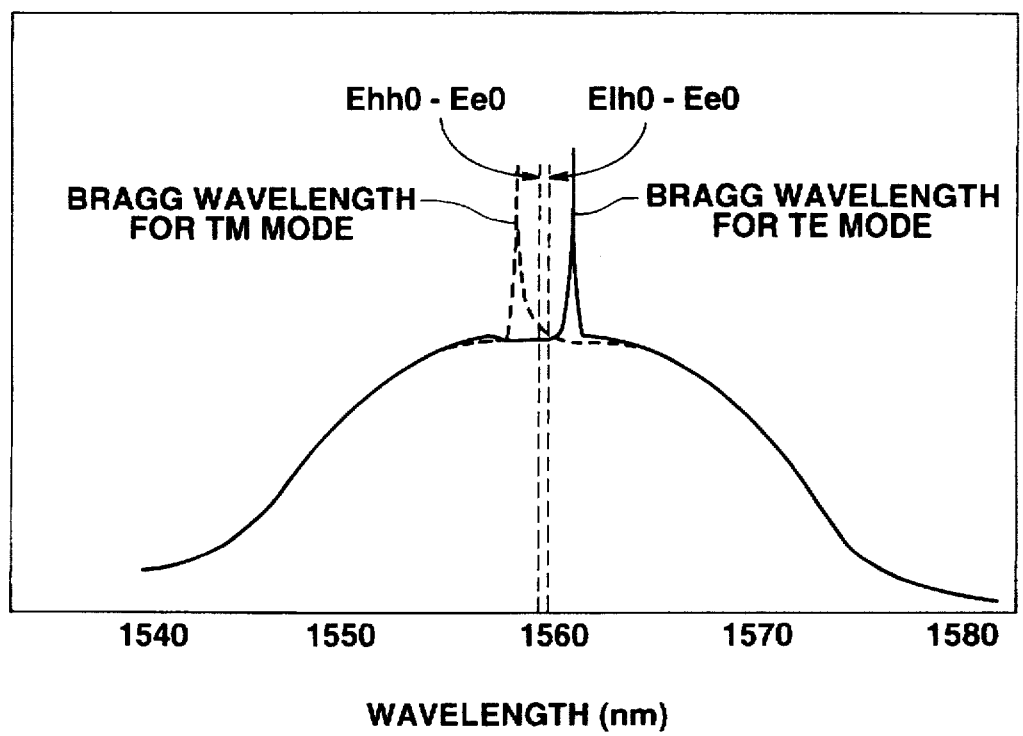
FIG. 5 is a graph illustrating gain profiles for the TE mode and the TM mode and an oscillation wavelength of the first embodiment of the present invention.

In the above-discussed structure, when a forward bias current is injected between the p-side electrode 113 and the n-side electrode 115, and a state immediately before laser oscillation is established, gain spectra for the TE mode and the TM mode are as illustrated in FIG. 5 wherein wavelengths corresponding to the transition energies (EhhO-EeO) and (ElhO-EeO) are respectively substantially equal to 1.56 µm and the gain spectrum for the TE mode (a solid line in FIG. 5) substantially overlaps on the gain spectrum for the TM mode (a dotted line in FIG. 5). The pitch of the diffraction grating 102 is set to 240 nm such that a distributed feedback wavelength due to the grating 102 falls near that wavelength (i.e., 1.56 µm). Thus, Bragg wavelengths for the TE mode and the TM mode are respectively 1.562 µm and 1.558 µm.

As the forward bias current between the electrodes 113 and 115 increases, oscillation occurs in the TE mode at the threshold of about 20 mA. Here, when a reverse electric field of 2 V is applied between the p-side electrode 114 and the n-side electrode 115, a central portion of light distribution in the TE mode is shifted toward the upper light guide layer 106 as illustrated in FIG. 6B from the position shown in FIG. 6A. As a result, the confinement into the active layer 104 and the coupling efficiency to the grating 102 are reduced for light in the TE mode, and hence the threshold for the TE mode increases. In contrast, light distribution in the TM mode remains unchanged even when the reverse electric field is applied to the upper light guide layer 106. Consequently, the threshold for the TM mode becomes lower than that for the TE mode, and the oscillation polarization mode is changed from the TE mode to the TM mode.

Figure 7:
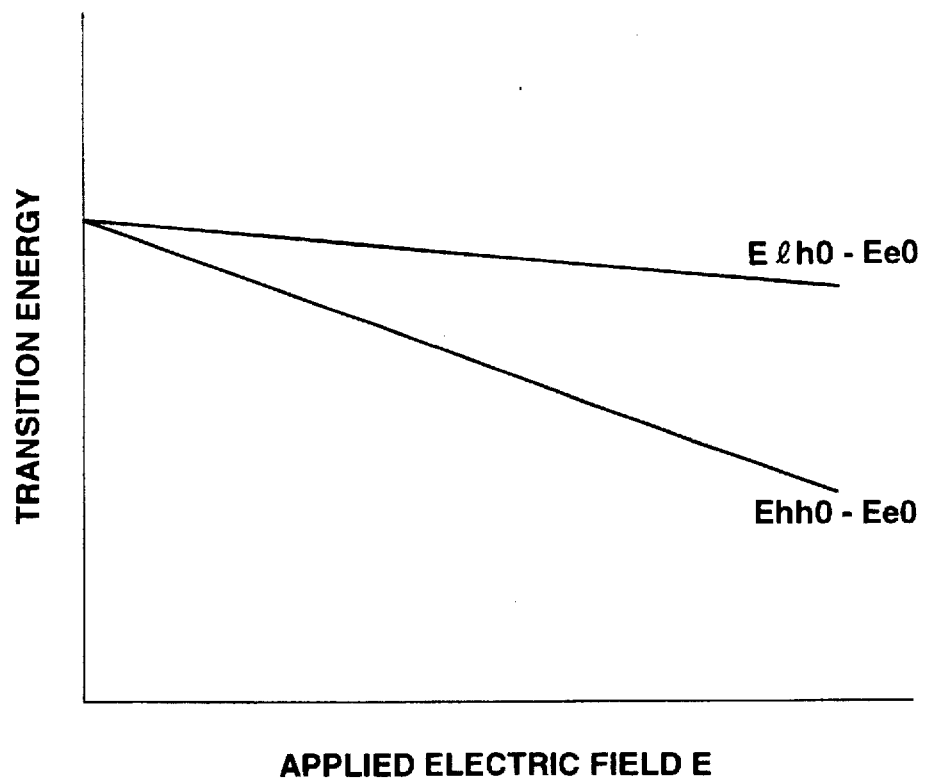
FIG. 7 is a graph illustrating the polarization-mode dependency of the quantum confinement Stark effect due to an electric field applied to a multiple qunatum well structure.
Figure 8A:
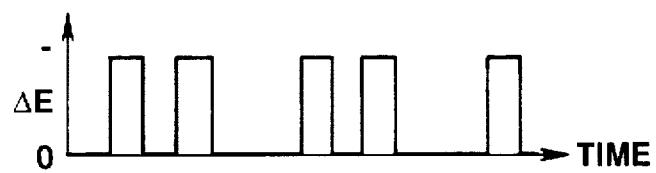
FIGS. 8A–8D are respectively graphs illustrating various modulated waveforms of the first embodiment of the present invention.
Figure 8B:
Figure 8C:
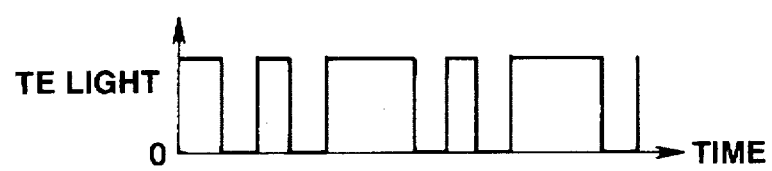
Figure 8D:
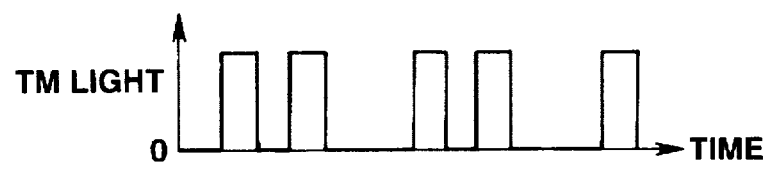

Such a polarization-mode dependency occurs because a change in the bandgap or the refractive index due to the quantum confinement Stark effect (QCSE), which occurs when a reverse voltage is applied to a MQW layer, has a polarization-mode dependency. As illustrated in FIG. 7, a change ratio of the refractive index for the TE mode, which is determined by the transition energy (EhhO-EeO), relative to the reverse voltage is larger than that of the refractive index for the TM mode, which is determined by the transition energy (ElhO-EeO), relative to the reverse voltage.

In the structure of this embodiment, when a digital signal having an amplitude of 2 V is applied between the electrodes 114 and 115, the oscillation polarization mode is switched between the TE mode and the TM mode. FIGS. 8A–8D illustrate waveforms of a modulated reverse electric field ΔE, a light output of the laser, light in the TE mode and light in the TM mode, respectively. As is known therefrom, the laser output light is not changed largely during the polarization-mode modulation, but TE and TM light waves, which are created after polarization-mode separation, are modulated in a mutually-complementary phase (see FIGS. 8C and 8D). Here, the modulation band range is from DC to 3 GHz. When that modulated light is to be transmitted, one of the TE mode and the TM mode is selected by, for example, a polarizer disposed in front of the laser emission end, and intensity-modulated light is generated. In this case, dynamic fluctuation of oscillation wavelength, or chirping, is less than 0.01 nm.

In the above-discussed structure, the tensile-strained MQW is used as the active layer 104, but other structures can be used, such as an InGaAsP single layer which has a bandgap wavelength of 1.56 μm falling between the TE-mode Bragg wavelength of 1.562 μm and the TM-mode Bragg wavelength of 1.558 μm, and a non-strained MQW whose Bragg wavelength is set close to the bandgap wavelength corresponding to the transition energy (ElhO-EeO). Further, the upper light guide layer 106 is comprised of the non-strained MQW structure in this embodiment, but a compressively-strained MQW (for example, plural pairs of InGaAs layers (thickness: 2 nm) and InGaAsP layers (thickness: 10 nm)) may be used to increase the polarization mode dependency. In addition thereto, the upper light guide layer 106 may also be comprised of an InGaAsP single layer having a bandgap wavelength of 1.45 μm. In this case, there is almost no polarization-mode dependency, but instead the Franz-Keldysh effect can be utilized.

In order to improve single mode characteristics, it is naturally advantageous to introduce a λ/4 shift section into the diffraction grating or provide an antireflection coat on the end facet of the device.

In this embodiment, fabrication precision required to the relationship between the gain peak of the active layer and the Bragg wavelength, the antireflection coating and the like is moderated, compared to a conventional polarization-mode switchable laser of a phase-control type as described in the related art.

Second Embodiment

A second embodiment of the present invention has substantially the same structure as the first embodiment. In the second embodiment, the refractive index of the upper light guide layer 106 is changed by current injection thereinto. The Bragg wavelength for the TM mode is set to 1.56 μm close to the gain peak, whereas the Bragg wavelength for the TE mode is set to 1.564 μm, and the gain for the TM mode is made slightly larger than that for the TE mode such that laser oscillation occurs in the TM mode when no current is injected into the upper light guide layer 106.

As a current injected into the upper light guide layer 106 increases, the refractive index is decreased due to the plasma effect and especially a central portion of light distribution in the TE mode is shifted toward the diffraction grating 102. Thus, the threshold gain for the TE mode is reduced, and the oscillation polarization mode is changed from the TM mode to the TE mode when the current amounts to about 40 mA. As a result, the polarization-mode switching is effectively achieved.

In a case where the oscillation mode is initially the TM mode owing to fabrication errors and the like, and the device cannot be driven in a manner described in the first embodiment, the device only needs to be driven as described in this embodiment.

Third Embodiment

Figure 9:
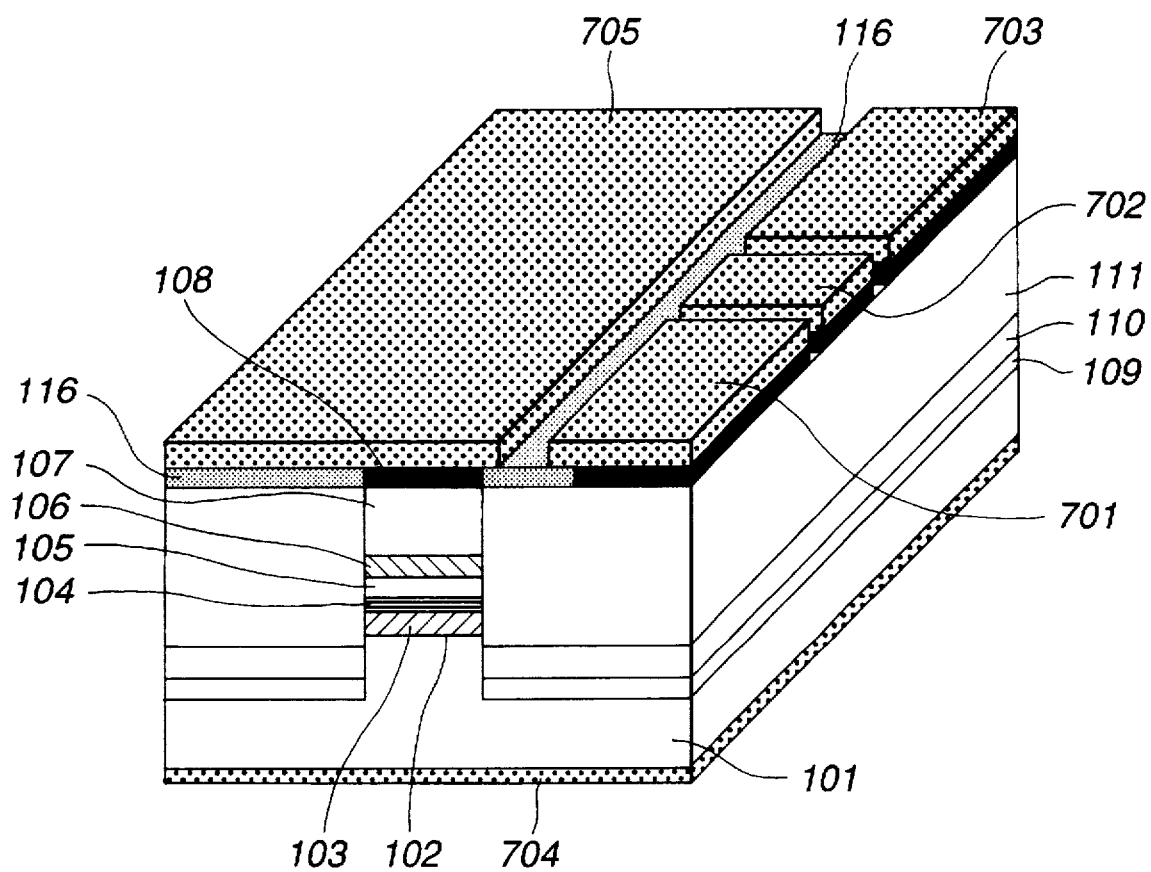
FIG. 9 is a perspective view illustrating a third embodiment of a three-electrode distributed feedback laser constructed in accordance with the present invention.

In a third embodiment of the present invention, the laser structure of the first embodiment is modified such that a plurality of electodes are arranged in a cavity direction. FIG. 9 illustrates a three-electrode laser of the third embodiment which can be built by dividing the electrode 115 and the contact layer 112 of FIG. 2 into three portions. Further, a λ/4 shift section is introduced into a central portion of the laser cavity and antireflection coats are deposited on both opposite end facets. Lengths of electrodes 701 and 703 are respectively 300 μm and the length of a central electrode 702 is 100 μm. The layer structure of this embodiment is the same as that of the first embodiment. In FIG. 9, the same reference numerals as those in FIG. 2 desiganate the same portions as those in FIG. 2.

In this embodiment, the oscillation wavelength can be changed by regulating a ratio between respective currents injected through the divided electrodes 701, 702 and 703. In the device of this embodiment, the oscillation wavelength can be continuously varied approximately 2 nm by changing the value of $I_2/(I_1+I_2+I_3)$ from 0.1 to 0.5, where $I_1$ is the current injected between the electrode 701 and a common electrode 704, $I_2$ is the current injected between the central electrode 702 and the common electrode 704 and $I_3$ is the current injected between the electrode 703 and the common electrode 704. Thus, the device of this embodiment can be employed as a light source for wavelength division multiplex transmission.

In this embodiment, the polarization-mode switching can be carried out only by applying a voltage signal having an amplitude of 5 V between the central electrode 702 and an electrode 705. The voltage amplitude in this embodiment is larger than that used in the first embodiment since a region for controlling the confinement of a light wave propagated in the waveguide is a portion of the central electrode 702 which is short in length. However, the modulation band range can be expanded up to 10 GHz because of a decrease in a floating capacitance generated in the device, compared to the first embodiment.

Fourth Embodiment

Figure 10:
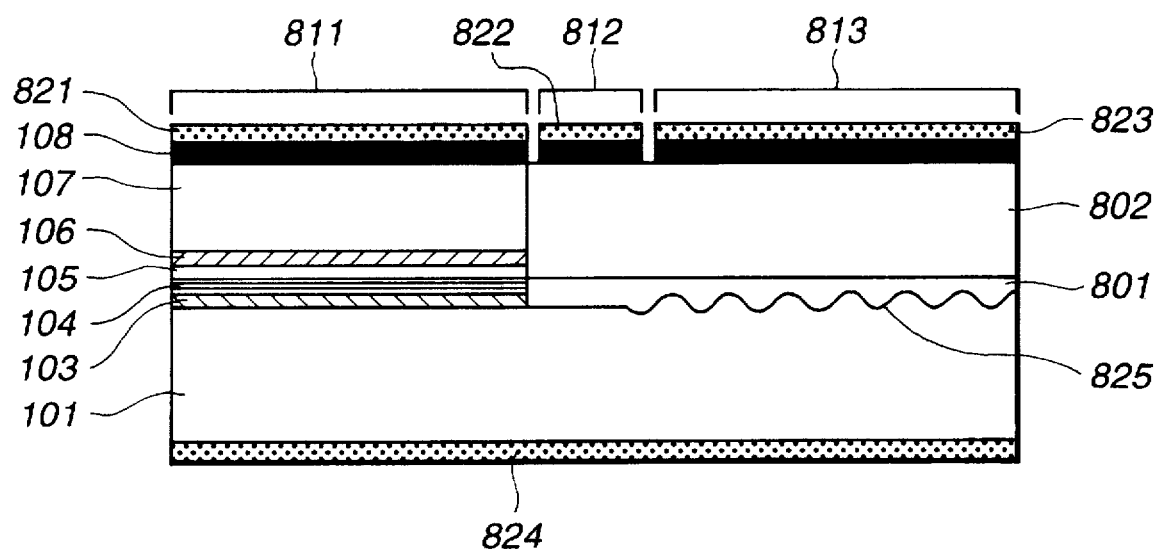
FIG. 10 is a cross-sectional view illustrating a fourth embodiment of a tunable distributed Bragg reflector laser constructed in accordance with the present invention.

In a fourth embodiment of the present invention, the concept of this invention is applied to a distributed Bragg reflector (DBR) laser. FIG. 10 illustrates a cross section of the DFB laser of this embodiment in a cavity direction. The burying heterostructure of this embodiment, which is a cross-sectional structure perpendicular to the cavity direction, is substantially the same as that of the first embodiment. In the fourth embodiment, the electrode structure is similar to that of the third embodiment. Namely, a portion corresponding to the electrode 115 in FIG. 2 is separated to three portions. Those electrodes 821, 822 and 823 respectively belong to an active region 811, a phase control region 812 and a DBR region 813. The active region 811 without a diffraction grating includes two light guide layers 103 and 106, similar to the first embodiment. The other layer structure 101, 104, 105, 107 and 108 of the active region 811 is also the same as that illustrated in FIG. 2. In the DBR region 813 and the phase control region 812, only one light guide layer 801 is formed. The light guide layer 801 has a thickness of 0.3 μm and is composed of an intrinsic InGaAsP whose bandgap wavelength is 1.15 μm. In FIG. 10, reference numeral 802 designates a clad layer. Reference numeral 824 designates a common electrode on the bottom surface of the substrate 101. Reference numeral 825 designates a diffraction grating formed on a part of the substrate 101 in the DBR region 813.

Oscillation polarization-mode switching is conducted by applying a modulated voltage to the upper light guide layer 106 in the active region 811 while a current is injected between the electrode 821 and the common electrode 824, in a manner similar to the above-described embodiments. In the laser device of this embodiment, the refractive index of the waveguide is varied by changing currents injected into the DBR region 813 and the phase adjusting region 812 between the electrodes 823 and 822 and the common electrode 824. Thereby, the Bragg wavelength is changed and the oscillation wavelength can be varied over a range of about 3 nm. Thus, the laser of this embodiment can also be used as a tunable light source for wavelength division multiplex transmission, similar to the third embodiment.

Fifth Embodiment

Each of the first to fourth embodiments is directed to a dynamic single mode laser with a diffraction grating, but the concept of the present invention can be applied to a Fabry-Perot laser which lacks a diffraction grating and whose end facets are cleaved. The structure of the fifth embodiment is substantially the same as that of the first embodiment, except that no diffraction grating is formed at the boundary between the p-type InP substrate 101 and the lower light guide layer 103. The single modal characteristic of this embodiment is not as good as the other embodiments, but the polarization-mode switching can be attained in a manner similar to the first embodiment.

This embodiment can be used in simple optical communications, optical communications of a spatial-transmission type, optical information processings or the like which needs no wavelength multiplexing.

Sixth Embodiment

Figure 11:
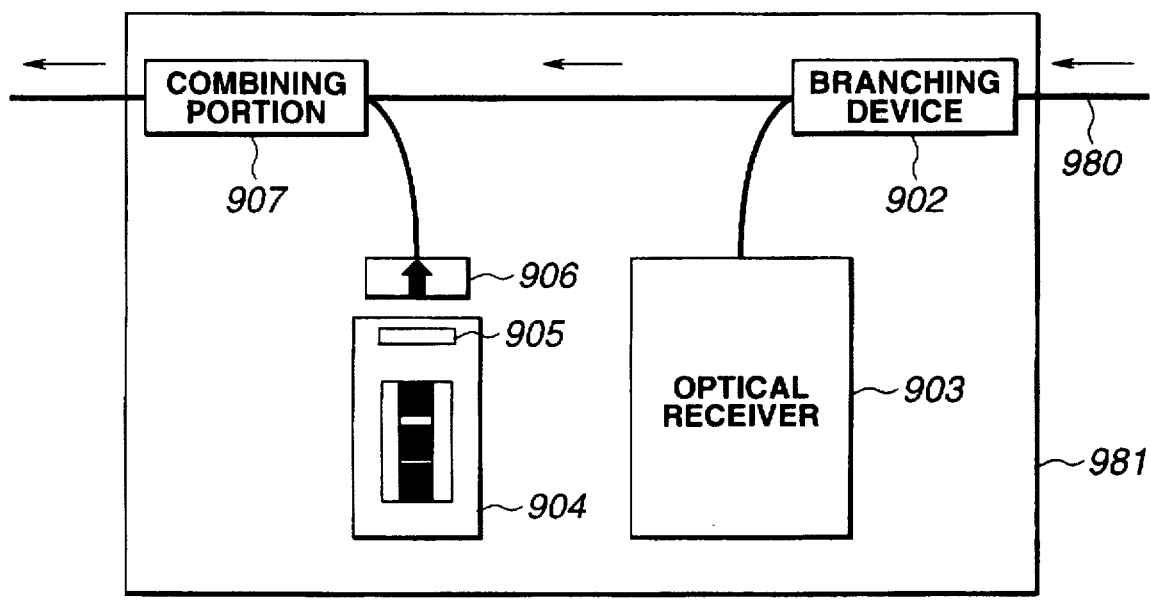
FIG. 11 is a block diagram illustrating the structure of a node using a semiconductor laser device of the present invention.

A sixth embodiment will now be described with reference to FIGS. 11 and 12. The sixth embodiment is directed to an optical local area network (LAN) system or a wavelength division multiplexing optical LAN system using a semiconductor laser device of the present invention as a light source in a transmitter, for example. FIG. 11 illustrates an opto-electric converting unit (node), which is connected to a terminal of the optical LAN system shown in FIG. 12.

Figure 12:
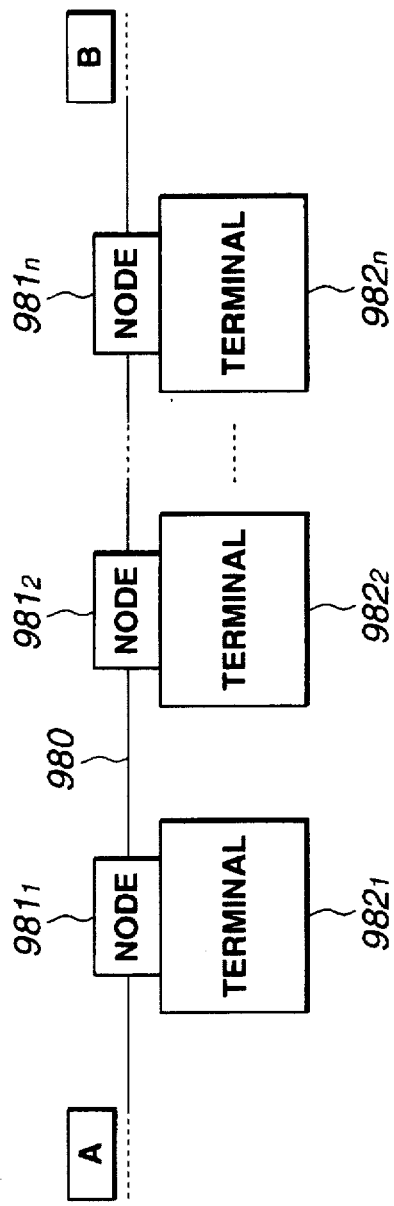
FIG. 12 is a block diagram illustrating the structure of an optical LAN system using a semiconductor laser device of the present invention.

In the bus-type network shown in FIG. 12, multiple terminals $982_1, 982_2, \ldots, 982_n$ are respectively connected to an optical fiber 980 through nodes $981_1, 981_2, \ldots, 981_n$ along a direction from A to B.

In FIG. 11, a light signal is taken into the node 981 through the optical fiber 980, and a portion of the signal is input into an optical receiver 903 by a branching device 902. The optical receiver 903 includes a tunable optical filter and a photodetector, and only signal light at a desired wavelength is taken out from the incident signal light, and the signal is detected. As the tunable optical filter, a fiber Fabry-Perot filter, a Max-Zehnder filer, an interference filter, or the like can be used.

On the other hand, when a light signal is transmitted from the node 981, signal light from a semiconductor laser device 904 of the present invention is input into the optical fiber 980 at a combining portion 907 through an isolator 906 which is inserted for prevention of adverse influence due to return light. The laser 904 is driven by a method described in the above embodiments, and a polarization-modulated light wave emitted from the laser 904 is converted to an intensity-modulated light output by a polarizer 905 or the like.

As the laser device 904, a tunable DFB laser of the third embodiment or a tunable DBR laser of the fourth embodiment is preferable. In a case where terminals only require a single-wavelength transmission, a DFB laser of the first embodiment is preferable.

A plurality of tunable optical filters and semiconductor lasers may be arranged in a node to widen the wavelength tunable range. Further, two nodes may be connected to each terminal and two optical fibers may be provided to accomplish bi-directional transmission of a DQDB system.

The types of networks which may be used include a loop type constructed by connecting A and B in FIG. 12, a star type, or a compound configuration thereof.

According to the polarization-mode modulation of the present invention, since the wavelength fluctuation during modulation can be less than 0.01 nm as described above, a high-density wavelength division multiplex transmission of 200 (=2/0.01) channels can be achieved when the wavelength tunable range of the laser is 2 nm, for example.

Seventh Embodiment

Figure 13:
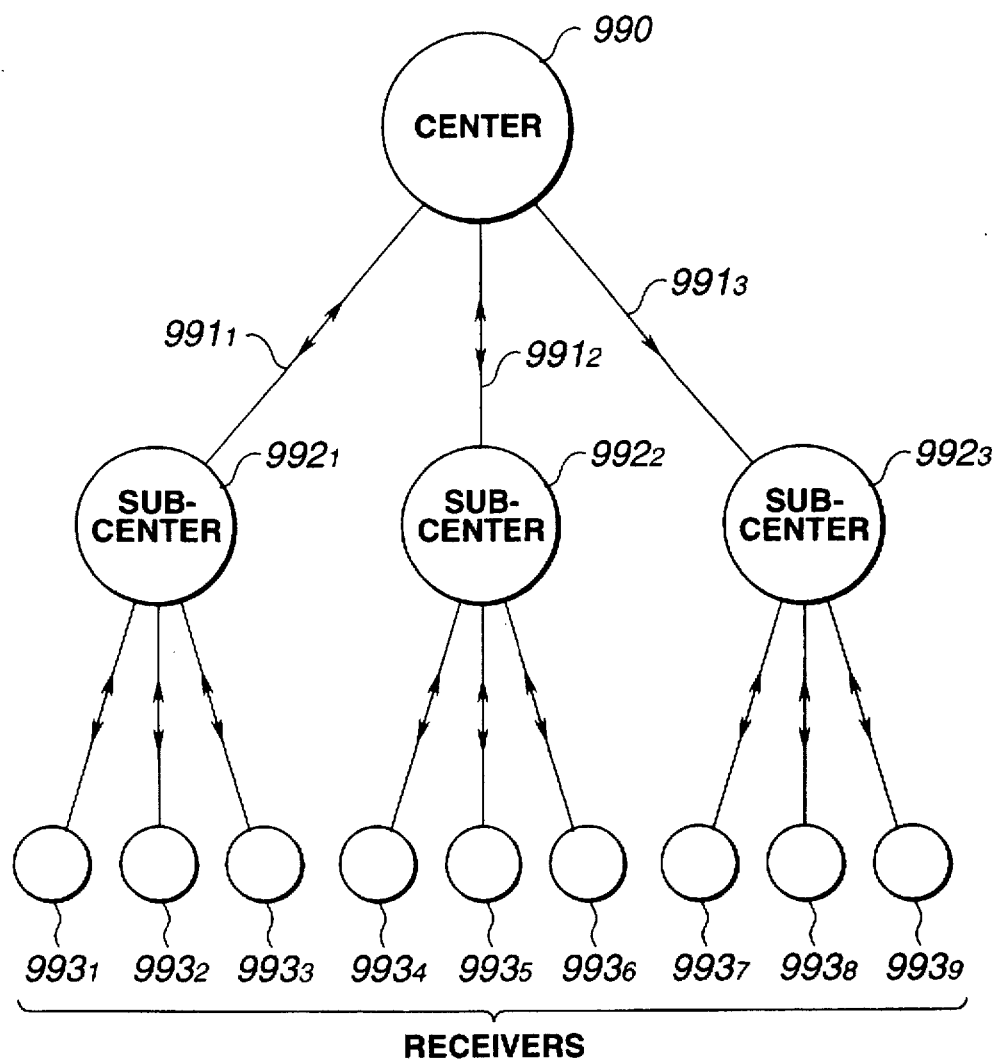
FIG. 13 is a block diagram illustrating the structure of a bi-directional optical CATV system using a semiconductor laser device of the present invention.

A bi-directional optical CATV system, as shown in FIG. 13, can be constructed using a semiconductor device and an optical communication system of the present invention. In FIG. 13, reference numeral 990 is a CATV center, reference numerals $992_1, 992_2$ and $992_3$ are respectively sub-centers connected to the center 990 by optical fibers $991_1, 991_2$ and $991_3$, and reference numerals $993_1, 993_2, \ldots, 993_9$ are respectively receivers of subscribers connected to the sub-centers $992_1, 992_2$ and $992_3$. In the center 990, a light source apparatus or tunable laser is polarization-modulated by a driving method described in the above embodiments, and a plurality of video signals are carried on signal light of different wavelengths to transmit the signals to the receivers $993_1, 993_2, \ldots, 993_9$. Each receiver includes a tunable wavelength filter and a photodetector, and only signal light at a desired wavelength of input signal light is detected to reproduce a picture image on a monitor. On the subscriber side, the transmission wavelength of the tunable filter is changed to select a desired channel. Thus, a desired picture image can be obtained. Conventionally, it was difficult to use such a DFB filter in that system due to dynamic wavelength fluctuation of a DFB laser. The semiconductor laser device of the present invention enables the use of such a DFB filter.

Further, a bi-directional CATV is possible in the following manner. Each of the receivers $993_1, 993_2, \ldots, 993_9$ has an external modulator (for an example of a simple bi-directional optical CATV, see, Ishikawa and Furuta "LiNbO₃ Optical Wavelength Modulator For Bi-directional Transmission in Optical CATV Subscriber Systems", OCS 91-82 1991), and a signal from the subscriber is received as a reflected light (reflected light of a signal light transmitted to the subscriber) from its external modulator. Thus, highly improved services can be obtained.

Except as otherwise disclosed herein, the various components shown in outline or block form in the Figures are individually well known in the optical semiconductor device and optical communication arts, and their internal construction and operation are not critical either to the making or using of this invention or to a description of the best mode of the invention.

While the present invention has been described with respect to what are presently considered to be the preferred embodiments, it is to be understood that the invention is not limited to the disclosed embodiments. The present invention is intended to cover various modifications and equivalent arrangements included within the spirit and scope of the appended claims.

What is claimed is:

1. A semiconductor laser device comprising:

a semiconductor substrate;

an active layer, said active layer being formed on said substrate extending along a light propagation direction;

a first light guide layer, said first light guide layer extending along said active layer to form a waveguide together with said active layer in which light waves in two different polarization modes can be propagated;

current injection means for injecting a laser bias current into said active layer; and control means for supplying one of a current and a voltage to said first light guide layer independently from the laser bias current injected by said current injection means, wherein said first light guide layer is formed such that coupling states, in which the light waves in the two different polarization modes are respectively coupled to said active layer and said first light guide layer, can be changed independently from each other by controlling one of the current and the voltage supplied by said control means.

2. A semiconductor laser device according to claim 1, further comprising a second light guide layer, said second light guide layer extending along said active layer to form the waveguide together with said active layer and said first light guide layer, said active layer being sandwiched between said first and second light guide layers, and wherein said current injection means injects a common laser bias current into said active layer and said second light guide layer, and said first light guide layer is formed such that coupling states, in which the light waves in the two different polarization modes are respectively coupled to said active layer and said first and second light guide layers, can be changed independently from each other by controlling one of the current and the voltage supplied by said control means.

3. A semiconductor laser device according to claim 2, further comprising a diffraction grating, said grating extending along said active layer and being formed on said second light guide layer, and wherein said laser device is constructed as a distributed feedback laser with said diffraction grating.

4. A semiconductor laser device according to claim 1, wherein said active layer and said first light guide layer constitute the waveguide in which said active layer and said first light guide layer are optically coupled such that a propagation transverse mode remains unchanged along the waveguide.

5. A semiconductor laser device according to claim 1, further comprising a diffraction grating, said grating extending along and near said active layer, and wherein said laser device is constructed as a distributed feedback laser with said diffraction grating.

6. A semiconductor laser device according to claim 5, wherein said diffraction grating comprises a phase shift section.

7. A semiconductor laser device according to claim 5, further comprising a plurality of end facets and an antireflection coat provided on at least one of said plurality of end facets of said laser device.

8. A semiconductor laser device according to claim 1, further comprising a third light guide layer and a diffraction grating formed along said third light guide layer, said third light guide layer and said diffraction grating being serially coupled to said active layer and said first light guide layer along the light propagation direction, and wherein said laser device is constructed as a distributed Bragg reflector laser in which a distributed reflector of said diffraction grating is formed along the light propagation direction.

9. A semiconductor laser device according to claim 8, further comprising second current injection means for injecting a current into said third light guide layer to change a refractive index thereof, whereby a laser oscillation wavelength can be varied by changing the current injected into said third light guide layer by said second current injection means.

10. A semiconductor laser device according to claim 1, wherein the two different polarization modes are respectively a transverse electric (TE) mode and a transverse magnetic (TM) mode, and said first light guide layer comprises a multiple quantum well layer which is constructed such that a change in a refractive index of said first light guide layer for the TE mode is larger than a change in a refractive index of said first light guide layer for the TM mode at the time when the refractive index of said first light guide layer is varied by applying a reverse voltage thereto by said control means, and said multiple quantum well layer is constructed such that an oscillation polarization mode of said laser device can be switched from the TE mode to the TM mode when the reverse voltage is applied to said first light guide layer by said control means.

11. A semiconductor laser device according to claim 10, said multiple quantum well layer containing a plurality of well layers to which a compressive strain is imparted.

12. A semiconductor laser device according to claim 1, wherein the two different polarization modes are respectively a transverse electric (TE) mode and a transverse magnetic (TM) mode, and said first light guide layer comprises a multiple quantum well layer which is constructed such that a change in a refractive index of said first light guide layer for the TE mode is larger than a change in a refractive index of said first light guide layer for the TM mode at the time when the the refractive index of said first light guide layer is varied by injecting a forward current thereto by said control means, and said multiple quantum well layer is constructed such that an oscillation polarization mode of said laser device can be switched from the TM mode to the TE mode when the forward current is injected into said first light guide layer by said control means.

13. A semiconductor laser device according to claim 12, said multiple quantum well layer containing a plurality of well layers to which a compressive strain is imparted.

14. A semiconductor laser device according to claim 1, further comprising a diffraction grating constituting one of a distributed feedback laser and a distributed Bragg reflector laser, wherein the two different polarization modes are respectively a transverse electric (TE) mode and a transverse magnetic (TM) mode, said active layer comprises a multiple quantum well layer, and a pitch of said grating is set such that a Bragg wavelength due to said grating falls near a wavelength corresponding to a bandgap energy between a ground level of light holes and a ground level of electrons of said active layer, which imparts a gain chiefly to the TM mode, and that threshold gains at the Bragg wavelength for the TE mode and the TM mode are approximately equal to each other.

15. A semiconductor laser device according to claim 1, wherein said active layer comprises a multiple quantum well layer into which a tensile strain is introduced such that a bandgap energy beween a ground level of heavy holes and a ground level of electrons is substantially equal to or larger than a bandgap energy beween a ground level of light holes and the ground level of electrons.

16. A semiconductor laser device according to claim 1, futher comprising a burying layer for laterally surrounding the waveguide, a barrier layer interposed between said active layer and said first light guide layer, and a topmost layer formed on said first guide layer, and wherein conductivity types of a side of said substrate and said topmost layer are the same, the conductivity type of said barrier layer is different from the conductivity type of the side of said substrate and said topmost layer, and the conductivity type of said burying layer is the same as the conductivity type of said barrier layer, such that p-n junctions are respectively formed through said active layer inbetween and through said first light guide layer inbetween, whereby an oscillation polarization mode of said laser device can be switched between the two different polarization modes mode by changing one of the current and the voltage supplied to said first light guide layer by said control means.

17. A semiconductor laser device according to claim 16, wherein each of said current injection means and said control means comprises a common electrode formed on said burying layer.

18. A semiconductor laser device according to claim 16, wherein said current injection means comprises a plurality of common electrodes formed on said burying layer along the light propagation direction of the waveguide and an electrode formed on a bottom surface of said substrate, and said control means comprises said plurality of common electrodes and an electrode formed on said first light guide layer such that one of the current and the voltage can be unevenly supplied to said first light guide layer along the light propagation direction of the waveguide, whereby a laser oscillation wavelength can be varied by changing an uneven current injected into said active layer along the light propagation direction by said current injection means and the oscillation polarization mode can be switched by changing one of the current and the voltage unevenly supplied to said first light guide layer along the light propagation direction.

19. A semiconductor laser device according to claim 1, wherein said active layer comprises a single layer composed of a semiconductor compound.

20. A semiconductor laser device according to claim 1, further comprising a diffraction grating constituting one of a distributed feedback laser and a distributed Bragg reflector laser, wherein said active layer comprises a non-strained multiple quantum well layer, and a pitch of said grating is set such that a Bragg wavelength falls near a wavelength corresponding to a bandgap energy between a ground level of light holes and a ground level of electrons of said active layer.

21. A semiconductor laser device according to claim 1, wherein said first light guide layer comprises a single layer composed of a semiconductor compound such that a refractive index thereof is changed due to a Franz-Keldysh effect.

22. A semiconductor laser device according to claim 1, further comprising cleaved end facets to constitute Fabry-Perot laser.

23. A method for driving a semiconductor laser device which includes an active layer formed on a substrate extending along a light propagation direction, a first light guide layer extending along the active layer to form a waveguide together with the active layer in which light waves in two different polarization modes can be propagated, current injection means for injecting a laser bias current into the active layer and control means for supplying one of a current and a voltage to the first light guide layer independently from the laser bias current injected by the current injection means, said method comprising the steps of:

injecting a laser bias current into the active layer;

supplying one of a current and a voltage to the first light guide layer; and changing one of the current and the voltage independently from the laser bias current to perform an oscillation polarization-mode switching between the two different polarization modes.

24. A method for driving a semiconductor laser device which includes an active layer formed on a substrate extending along a light propagation direction, a first light guide layer extending along the active layer to form a waveguide together with the active layer in which light waves in two different polarization modes can be propagated, a burying layer for laterally surrounding the waveguide, current injection means for injecting a laser bias current into the active layer and control means for supplying one of a current and a voltage to the first light guide layer independently from the laser bias current injected by the current injection means, and in which the current injection means comprises a plurality of common electrodes formed on the burying layer along the light propagation direction of the waveguide and an electrode formed on a bottom surface of the substrate, and the control means comprises the plurality of common electrodes and an electrode formed on the first light guide layer, said method comprising the steps of:

changing an uneven current injected into the active layer along the light propagation direction by using the common electrodes to change a laser oscillation wavelength of the laser device; and changing one of the current and the voltage supplied to the first light guide layer partly along the light propagation direction by using the plurality of common electrodes to perform an oscillation polarization-mode switching between the two different polarization modes.

25. A method for driving a semiconductor laser device which includes an active layer formed on a substrate extending along a light propagation direction, a first light guide layer extending along the active layer to form a waveguide together with the active layer in which light waves in two different polarization modes can be propagated, a third light guide layer and a diffraction grating formed along the third light guide layer, the third light guide layer and the diffraction grating being serially coupled to the active layer and the first light guide layer along the light propagation direction, current injection means for injecting a laser bias current into the active layer, control means for supplying one of a current and a voltage to the first light guide layer independently from the laser bias current injected by the current injection means and second current injection means for injecting a current into the third light guide layer to change a refractive index thereof, wherein said laser device is constructed as a distributed Bragg reflector laser in which a distributed reflector of said diffraction grating is formed along the light propagation direction, said method comprising the steps of:

changing a current injected into the third light guide layer by the second current injection means to change a laser oscillation wavelength of the laser device; and changing one of the current and the voltage independently from the laser bias current to perform an oscillation polarization-mode switching between the two different polarization modes.

26. An optical communication system for communicating over a light transmission line that transmits signals from a transmitter side to a receiver side, said system comprising:

a semiconductor laser device, said semiconductor laser device including:

a semiconductor substrate;

an active layer, said active layer being formed on said substrate extending along a light propagation direction;

a first light guide layer, said first light guide layer extending along said active layer to form a waveguide together with said active layer in which light waves in two different polarization modes can be propagated;

current injection means for injecting a laser bias current into said active layer;

control means for supplying one of a current and a voltage to said first light guide layer independently from the laser bias current injected by said current injection means, wherein said first light guide layer is formed such that coupling states, in which the light waves in the two different polarization modes are respectively coupled to said active layer and said first light guide layer, can be changed independently from each other by controlling one of the current and the voltage supplied by said control means;

polarization-mode selecting means for selecting light in one of the two different polarization modes emitted from said semiconductor laser device;

coupling means for coupling light in one of the two different polarization modes from said semiconductor laser device to the light transmission line; and a receiver for detecting the light in one of the two different polarization modes transmitted through the light transmission line, said receiver being disposed on the receiver side.

27. An optical communication system according to claim 26, said semiconductor laser device being constructed such that an oscillation wavelength thereof can be changed, and said receiver detects the light at a wavelength selected by a tunable band pass filter.

28. An opto-electric converting apparatus, said apparatus comprising:

a semiconductor laser device, said semiconductor laser device including:

a semiconductor substrate;

an active layer, said active layer being formed on said substrate extending along a light propagation direction;

a first light guide layer, said first light guide layer extending along said active layer to form a waveguide together with said active layer in which light waves in two different polarization modes can be propagated;

current injection means for injecting a laser bias current into said active layer;

control means for supplying one of a current and a voltage to said first light guide layer independently from the laser bias current injected by said current injection means, wherein said first light guide layer is formed such that coupling states, in which the light waves in the two different polarization modes are respectively coupled to said active layer and said first light guide layer, can be changed independently by controlling one of the current and the voltage supplied by said control means;

polarization-mode selecting means for selecting light in one of the two different polarization modes emitted from said semiconductor laser device;

coupling means for coupling light in one of the two different polarization modes from said semiconductor laser device to a light transmission line; and a receiver for detecting the light in one of the two different polarization modes transmitted through the light transmission line.

29. An opto-electric converting apparatus according to claim 28, wherein said semiconductor laser device is constructed such that an oscillation wavelength thereof can be changed, and said receiver detects the light at a wavelength selected by a tunable band pass filter.

30. A light source apparatus comprising:

a semiconductor laser device, said semiconductor laser device including:

a semiconductor substrate;

an active layer, said active layer being formed on said substrate extending along a light propagation direction;

a first light guide layer, said first light guide layer extending along said active layer to form a waveguide together with said active layer in which light waves in two different polarization modes can be propagated;

current injection means for injecting a laser bias current into said active layer;

control means for supplying one of a current and a voltage to said first light guide layer independently from the laser bias current injected by said current injection means, wherein said first light guide layer is formed such that coupling states, in which the light waves in the two different polarization modes are respectively coupled to said active layer and said first light guide layer, can be changed independently by controlling one of the current and the voltage supplied by said control means; and polarization-mode selecting means for selecting light in one of the two different polarization modes emitted from said semiconductor laser device.

31. A light source apparatus according to claim 30, said semiconductor laser device being constructed such that an oscillation wavelength thereof can be changed.

32. An optical cable television system for communicating over a light transmission line that transmits signal light from a broadcasting center to a subscriber side, said system comprising:

a semiconductor laser device, said semiconductor laser device including:

a semiconductor substrate;

an active layer, said active layer being formed on said substrate extending along a light propagation direction;

a first light guide layer, said first light guide layer extending along said active layer to form a waveguide together with said active layer in which light waves in two different polarization modes can be propagated;

current injection means for injecting a laser bias current into said active layer;

control means for supplying one of a current and a voltage to said first light guide layer independently from the laser bias current injected by said current injection means, wherein said first light guide layer is formed such that coupling states, in which the light waves in the two different polarization modes are respectively coupled to said active layer and said first light guide layer, can be changed independently from each other by controlling one of the current and the voltage supplied by said control means;

polarization-mode selecting means for selecting light in one of the two different polarization modes emitted from said semiconductor laser device;

coupling means for coupling light in one of the two different polarization modes from said semiconductor laser device to the light transmission line, said semiconductor laser device, said polarization-mode selecting means and said coupling means being disposed at the broadcasting center; and a receiver and an optical filter for detecting light in one of the two different polarization modes transmitted through the light transmission line, said receiver and said optical filter being disposed on the subscriber side.

* * * * *

UNITED STATES PATENT AND TRADEMARK OFFICE
CERTIFICATE OF CORRECTION

PATENT NO. : 5,757,828
DATED : May 26, 1998
INVENTOR(S) : Ouchi

It is certified that error appears in the above-identified patent and that said Letters Patent is hereby corrected as shown below:

COLUMN 5:

Line 24, "modes mode" should read --modes--.

COLUMN 7:

Line 15, "a" should read --an--; and
Line 64, "qunatum" should read --quantum--.

COLUMN 10:

Line 54, "on" should be deleted.

COLUMN 17:

Line 36, "mode" should be deleted--.

Signed and Sealed this

Sixth Day of July, 1999

Attest:

Q. TODD DICKINSON

*Attesting Officer*   Acting Commissioner of Patents and Trademarks